United States Patent
Park et al.

(10) Patent No.: US 10,424,688 B2
(45) Date of Patent: Sep. 24, 2019

(54) WIRE TRANSFER APPARATUS OF TABBING APPARATUS

(71) Applicant: ZEUS CO., LTD., Osan-si, Gyeonggi-do (KR)

(72) Inventors: Young Ik Park, Osan-si (KR); Jin Woo Park, Osan-si (KR); Dong Jin Chung, Suwon-si (KR)

(73) Assignee: ZEUS CO., LTD., Osan-si, Gyeonggi-Do (KR)

( * ) Notice: Subject to any disclaimer, the term of this patent is extended or adjusted under 35 U.S.C. 154(b) by 93 days.

(21) Appl. No.: 15/514,865

(22) PCT Filed: Sep. 22, 2015

(86) PCT No.: PCT/KR2015/009973
§ 371 (c)(1),
(2) Date: Mar. 28, 2017

(87) PCT Pub. No.: WO2016/068489
PCT Pub. Date: May 6, 2016

(65) Prior Publication Data
US 2017/0229601 A1    Aug. 10, 2017

(30) Foreign Application Priority Data
Oct. 27, 2014    (KR) .......................... 10-2014-0145691

(51) Int. Cl.
*B23K 37/04* (2006.01)
*H01L 31/18* (2006.01)
(Continued)

(52) U.S. Cl.
CPC .......... *H01L 31/188* (2013.01); *B23K 20/004* (2013.01); *B23K 37/04* (2013.01);
(Continued)

(58) Field of Classification Search
CPC ....... H01L 31/188; H01L 31/05; H01L 24/78; H01L 31/18; H01L 2224/78621;
(Continued)

(56) References Cited

U.S. PATENT DOCUMENTS 6,357,649 B1 * 3/2002 Okatsu .................... B23K 1/06
228/179.1
2011/0079587 A1   4/2011 Taboga
(Continued)

FOREIGN PATENT DOCUMENTS

JP    2005-235971    9/2005
KR    10-0813926    3/2008
(Continued)

OTHER PUBLICATIONS

International Search Report for International Application No. PCT/KR2015/009973, dated Feb. 23, 2016.
(Continued)

*Primary Examiner* — Kiley S Stoner
(74) *Attorney, Agent, or Firm* — Kile Park Reed & Houtteman PLLC

(57) ABSTRACT

Provided is a wire transfer apparatus of a tabbing apparatus. A wire transfer apparatus of a tabbing apparatus according to the present invention includes: a first transfer gripper unit configured to grip a wire; a second transfer gripper unit disposed in parallel to the first transfer gripper unit and configured to grip the wire at a location spaced apart from the first transfer gripper unit together with the first transfer gripper unit; and a gripper transfer unit configured to transfer the wire while moving the first transfer gripper unit and the second transfer gripper unit.

12 Claims, 6 Drawing Sheets

(51) Int. Cl.
*B23K 20/00* (2006.01)
*H01L 31/05* (2014.01)
*H01L 23/00* (2006.01)
*H01L 31/04* (2014.01)

(52) U.S. Cl.
CPC .............. *H01L 24/78* (2013.01); *H01L 31/05* (2013.01); *H01L 31/18* (2013.01); *H01L 31/04* (2013.01); *H01L 2224/78621* (2013.01); *H01L 2924/00014* (2013.01); *Y02E 10/50* (2013.01)

(58) Field of Classification Search
CPC ........... H01L 2924/00014; H01L 31/04; H01L 24/85; H01L 24/86; Y02E 10/50; Y02P 70/521; B23K 37/04–0461; B23K 20/004; B23K 20/005; B23K 20/007
USPC ..... 228/180.5, 4.5, 904, 212–213, 44.3–96.6
See application file for complete search history.

(56) References Cited

U.S. PATENT DOCUMENTS

| | | | |
|---|---|---|---|
| 2011/0265844 A1* | 11/2011 | Storbeck | H01L 31/0504 136/244 |
| 2011/0308404 A1 | 12/2011 | Haberstroh et al. | |
| 2012/0077302 A1* | 3/2012 | Abe | H01L 21/67132 438/80 |
| 2012/0085812 A1* | 4/2012 | Luechinger | B23K 20/10 228/110.1 |
| 2012/0228362 A1* | 9/2012 | Schultis | B21F 23/00 228/102 |
| 2013/0065353 A1* | 3/2013 | Albrecht | B32B 17/10036 438/73 |
| 2013/0112735 A1* | 5/2013 | Luechinger | H01L 31/0504 228/110.1 |
| 2016/0163909 A1* | 6/2016 | Gonzalez | H01L 31/188 29/25.01 |
| 2016/0163910 A1* | 6/2016 | Gonzalez | H01L 31/0504 438/80 |
| 2017/0179320 A1* | 6/2017 | Erben | H01L 31/0465 |

FOREIGN PATENT DOCUMENTS

| | | | | |
|---|---|---|---|---|
| KR | 10-1000495 | | 12/2010 | |
| KR | 10-1058399 | | 8/2011 | |
| KR | 10-2012-0087522 | | 8/2012 | |
| WO | WO-2014076134 A1 * | | 5/2014 | ......... H01L 31/0504 |

OTHER PUBLICATIONS

Written Opinion for International Application No. PCT/KR2015/009973, dated May 2, 2017.

* cited by examiner

FIG. 3
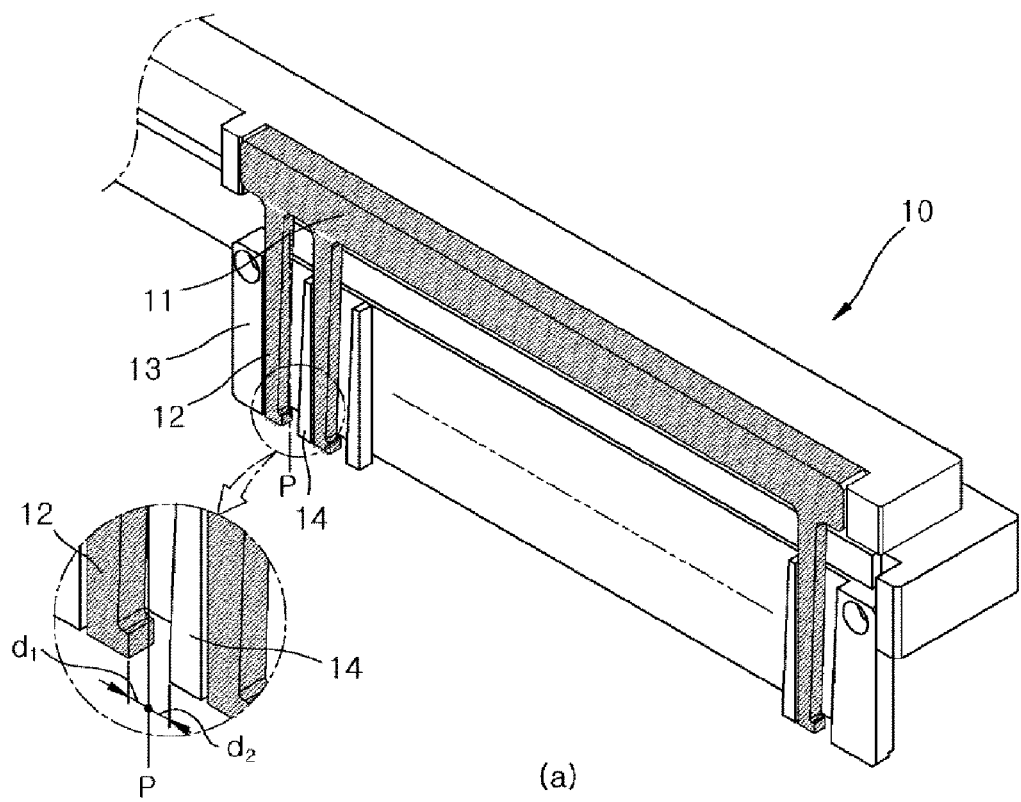
(a)
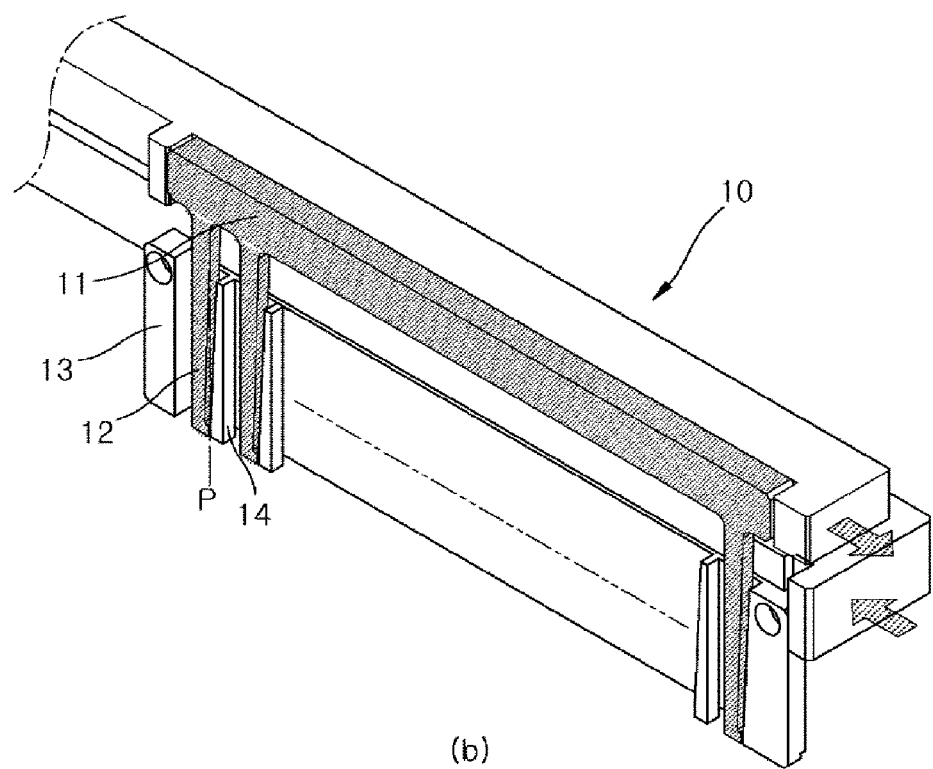
(b)

FIG. 4
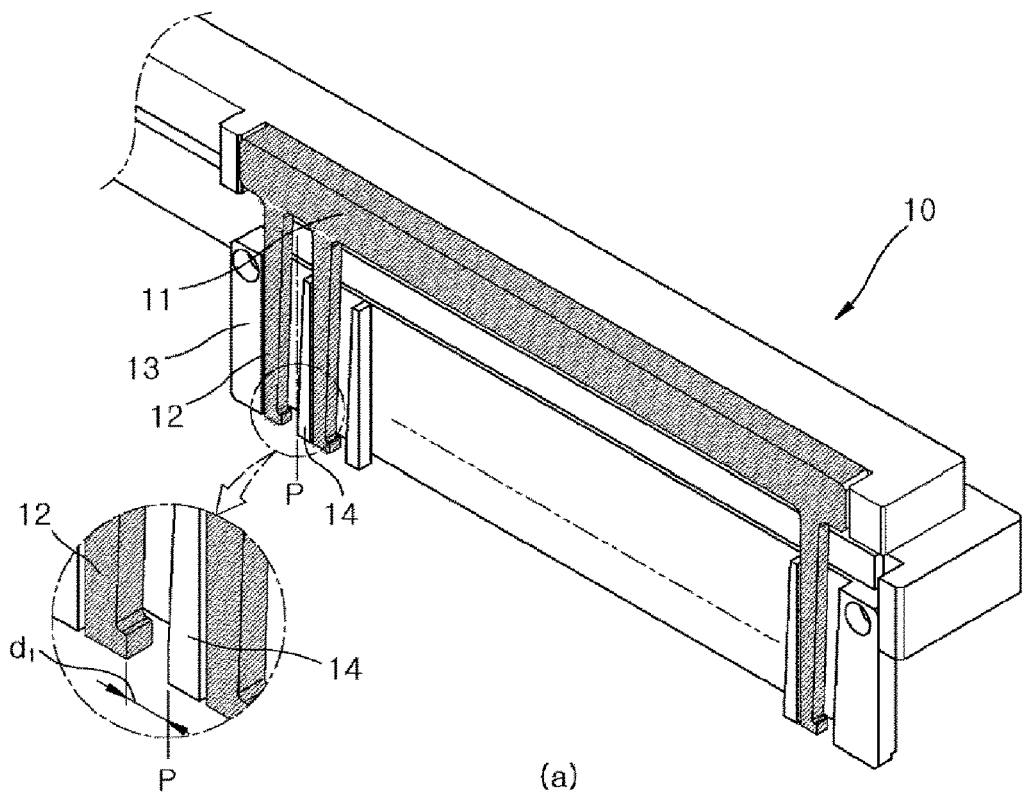
(a)
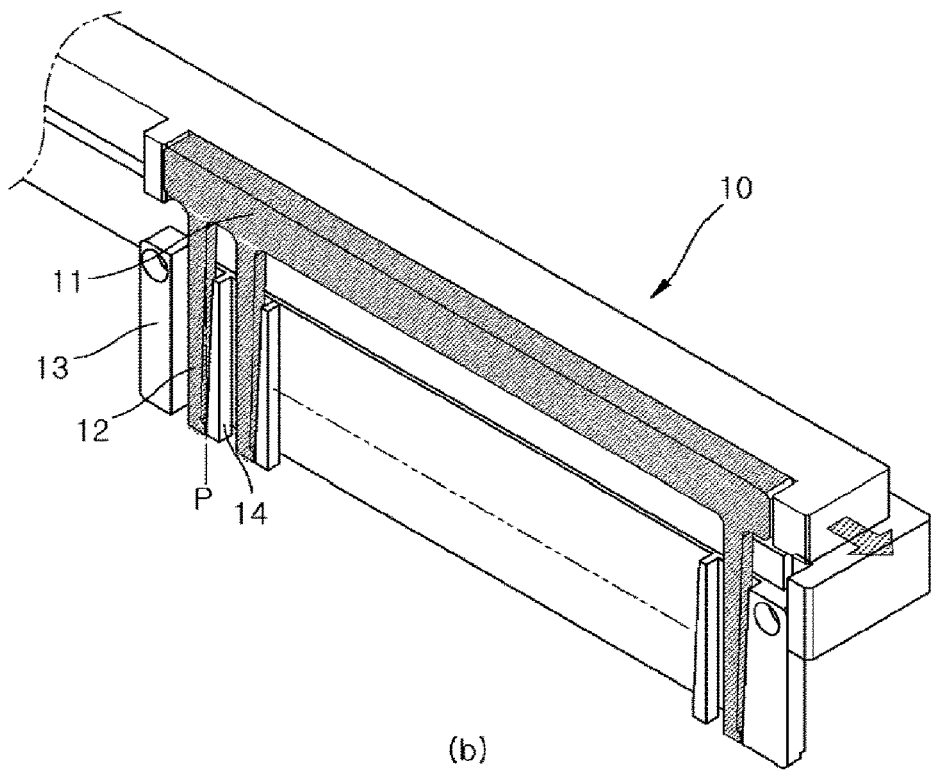
(b)

WIRE TRANSFER APPARATUS OF TABBING APPARATUS

TECHNICAL FIELD

The present invention relates to a wire transfer apparatus of a tabbing apparatus, and more particularly, to a wire transfer apparatus of a tabbing apparatus, which is configured to transfer a wire to a desired position.

BACKGROUND

Today, human beings have obtained a large amount of energy mainly from oil, coal, nuclear energy, natural gas, etc. but energy sources such as coal and nuclear energy are expected to be exhausted in the near future. Thus, countries of the world have accelerated research and development of new renewable energy. Particularly, solar generation has drawn much attention, since electric power can be obtained from any sunlit place and does not generate pollution unlike other generation methods.

For solar generation, a semiconductor device that converts solar energy into electrical energy is needed. The semiconductor device is referred to as a solar cell. In general, since a maximum voltage that can be generated by only one unit solar cell is about 0.5 V, a plurality of unit solar cells connected in series should be used. A structure in which unit solar cells are modularized by connecting them to one another is referred to as a solar cell module.

A process of manufacturing a solar cell module may be divided into a cell test process, a tabbing process, a lay-up process, a lamination process, and a module test process.

In the first process, i.e., the cell test process, a plurality of solar cells having various electric properties are tested and classified into several groups according to their electric properties. In the second process, i.e., the tabbing process, the plurality of solar cells are connected in series by wires. In the third process, i.e., the lay-up process, the plurality of solar cells that are connected in a line are arranged in a desired pattern and then low-iron reinforced glass, ethylene-vinyl acetate copolymer (EVA), a back sheet, etc. are stacked on them. In the fourth process, i.e., the lamination process, a resultant structure obtained in the form of a solar cell module by performing the lay-up process is vacuum-compressed at a high temperature to provide durability and a waterproof property. In the last process, i.e., the module test process, the finished solar cell module is tested for normal operation.

Here, the tabbing process in which the plurality of solar cells are connected in series by wires is a key process with respect to the process of manufacturing a solar cell module. When the wires are not appropriately bonded to the cells, the performance and quality of the whole solar cell module are degraded. The tabbing process will be briefly described below. A plurality of wires supplied from a reel are cut. Then, the wires and solar cells are exposed to a high-temperature atmosphere while repeating that one side of each wire is placed on a solar cell to lie on the cell and another solar cell is placed and stacked on the opposite side of each wire. In the high-temperature atmosphere, the wires are soldered onto the cells, and thus, the plurality of solar cells are electrically connected by the wires.

The background technology of the present invention is disclosed in Korean registered patent publication No. 10-1058399 entitled "Tabber-Stringer and Tabbing-Stringing Method" (registration date: Aug. 16, 2011).

SUMMARY

The present invention provides a wire transfer apparatus of a tabbing apparatus, which is capable of stably transferring a wire to a desired transfer position without deforming the wire.

A wire transfer apparatus of a tabbing apparatus according to the present invention includes: a first transfer gripper unit configured to grip a wire; a second transfer gripper unit disposed in parallel to the first transfer gripper unit and configured to grip the wire at a location spaced apart from the first transfer gripper unit together with the first transfer gripper unit; and a gripper transfer unit configured to transfer the wire while moving the first transfer gripper unit and the second transfer gripper unit.

Further, preferably, the first transfer gripper unit includes: a first gripper including a first wire contact portion; a second gripper forming a shape of a tong for gripping the wire together with the first gripper and including a second wire contact portion facing the first wire contact portion; and a gap adjustment device configured to adjust a gap between the first gripper and the second gripper.

Further, preferably, the gap adjustment device includes a first gripper pressurizing unit configured to pressurize the first gripper toward the second wire contact portion.

Further, preferably, the gap adjustment device further includes a second gripper pressurizing unit configured to pressurize the second gripper toward the first wire contact portion.

Further, preferably, the gripper transfer unit includes a horizontal movement unit configured to move the first transfer gripper unit and the second transfer gripper unit in a horizontal direction.

Further, preferably, the horizontal movement unit includes: a horizontal transfer unit configured to move the first transfer gripper unit and the second transfer gripper unit together by the same displacement; and a distance adjustment unit configured to adjust a distance between the first transfer gripper unit and the second transfer gripper unit.

Further, preferably, the distance adjustment unit includes: a first horizontal movement unit configured to move the first transfer gripper unit in a horizontal direction; and a second horizontal movement unit configured to move the second transfer gripper unit in a horizontal direction.

Further, preferably, the gripper transfer unit further includes a vertical movement unit configured to move the first transfer gripper unit and the second transfer gripper unit in a vertical direction.

Further, preferably, the vertical movement unit includes: an elevating transfer unit configured to move the first transfer gripper unit and the second transfer gripper unit together by the same displacement; and a height adjustment unit configured to adjust heights of the first transfer gripper unit and the second transfer gripper unit independently.

Further, preferably, the height adjustment unit includes: a first vertical movement unit configured to move the first transfer gripper unit in a vertical direction; and a second vertical movement unit configured to move the second transfer gripper unit in a vertical direction.

Further, preferably, the gripper transfer unit further includes a position adjustment unit configured to move the first transfer gripper unit and the second transfer gripper unit in a horizontal direction perpendicular to the horizontal movement unit.

Further, preferably, the wire transfer apparatus further includes a wire movement device configured to move the wire to a transfer standby position and to cut the wire at a set length corresponding to a distance between the first transfer gripper unit and the second transfer gripper unit.

Further, preferably, the wire movement device includes: a fixing gripper configured to pressurize and fix the wire; a movement gripper configured to move the wire by pulling the wire by a set distance in a state wherein the wire is unfixed from the fixing gripper; and a wire cut device configured to cut a portion of the wire located between the first transfer gripper unit and the fixing gripper in a state wherein a portion of the wire located between the fixing gripper and the movement gripper is gripped by the first transfer gripper unit and the second transfer gripper unit.

In the wire transfer apparatus of a tabbing apparatus according to the present invention, the first transfer gripper unit and the second transfer gripper unit can be moved by the same displacement by the gripper transfer unit in a state wherein one side and the opposite side of the wire are respectively gripped by the first transfer gripper unit and the second transfer gripper unit. Accordingly, the wire can be stably transferred to a desired position without causing stress that deforms the wire to be applied to the wire.

BRIEF DESCRIPTION OF THE DRAWINGS

FIG. 3 is a conceptual diagram illustrating an example of gripping a wire by a first transfer gripper unit included in a wire transfer apparatus of a tabbing apparatus according to an embodiment of the present invention.

FIG. 4 is a conceptual diagram illustrating another example of gripping a wire by a first transfer gripper unit included in a wire transfer apparatus of a tabbing apparatus according to an embodiment of the present invention.

DETAILED DESCRIPTION

Figure 1:
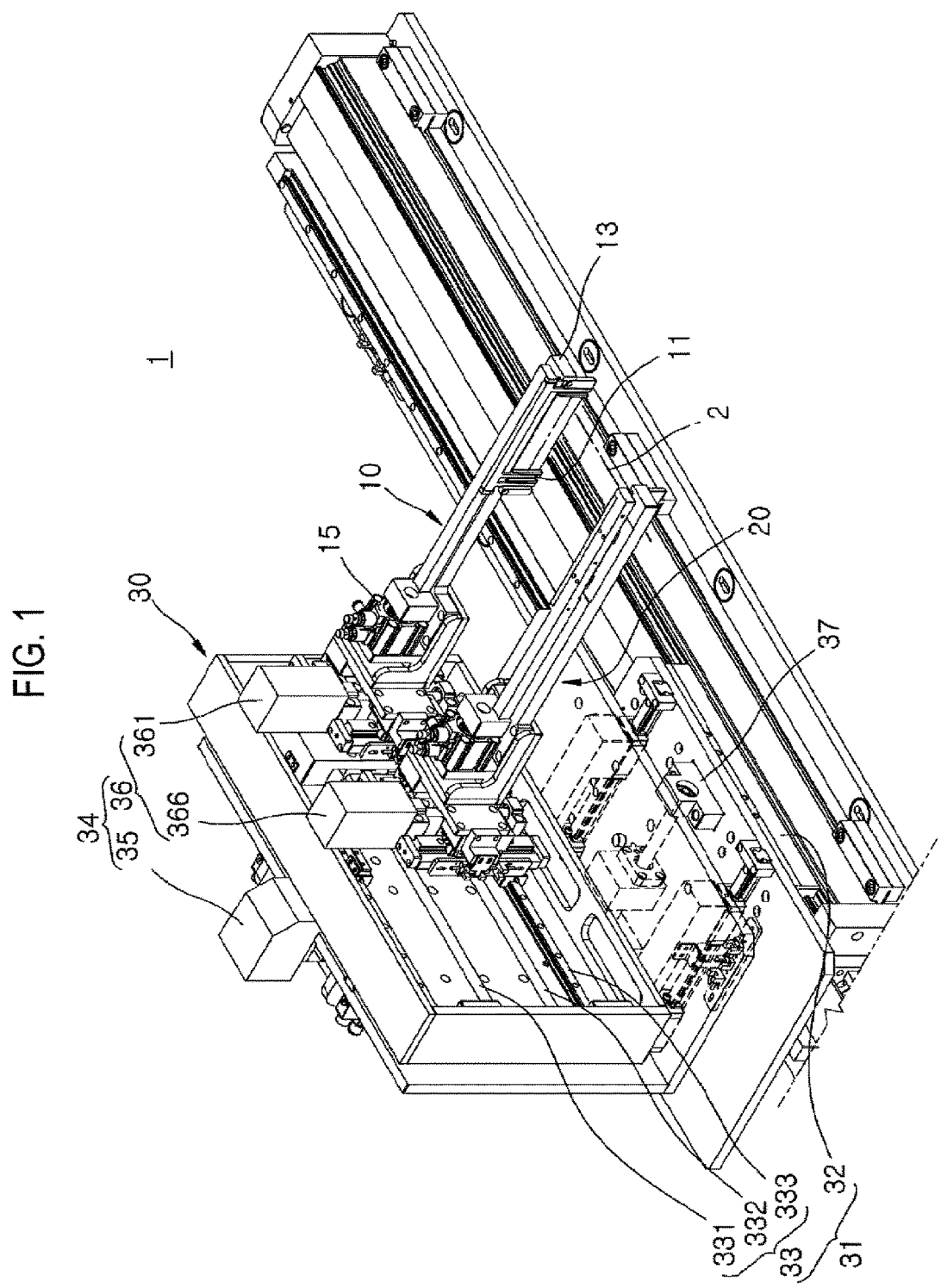
FIG. 1 is a perspective view of a wire transfer apparatus of a tabbing apparatus according to an embodiment of the present invention.

A wire transfer apparatus of a tabbing apparatus according to embodiments of the present invention will be described below with reference to the accompanying drawings.

For clarity and convenience of explanation, the thicknesses of lines or the sizes of components illustrated in the drawing may be exaggerated.

The specific terms used in the present disclosure are defined in consideration of functions of the present invention but may be differently defined according to the intention or custom of a user or an operator. Thus, the terms used herein should be defined based on the whole context of the present disclosure.

Figure 2:
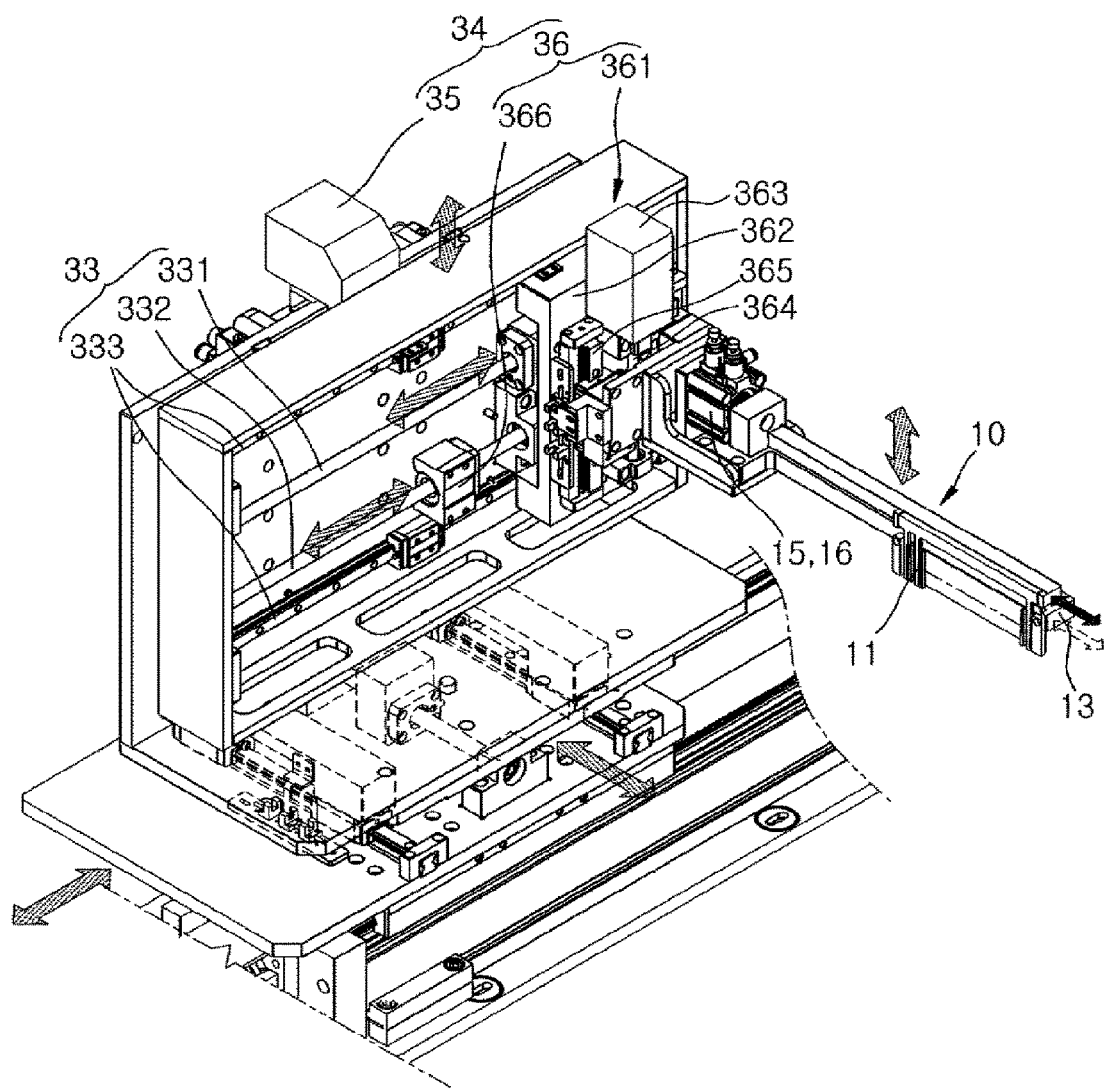
FIG. 2 is a partial perspective view for explaining an operation of a wire transfer apparatus of a tabbing apparatus according to an embodiment of the present invention.

FIG. 1 is a perspective view of a wire transfer apparatus of a tabbing apparatus according to an embodiment of the present invention. FIG. 2 is a partial perspective view for explaining an operation of a wire transfer apparatus of a tabbing apparatus according to an embodiment of the present invention.

FIG. 3 is a conceptual diagram illustrating an example of gripping a wire by a first transfer gripper unit included in a wire transfer apparatus of a tabbing apparatus according to an embodiment of the present invention. FIG. 4 is a conceptual diagram illustrating another example of gripping a wire by a first transfer gripper unit included in a wire transfer apparatus of a tabbing apparatus according to an embodiment of the present invention.

Figure 5:
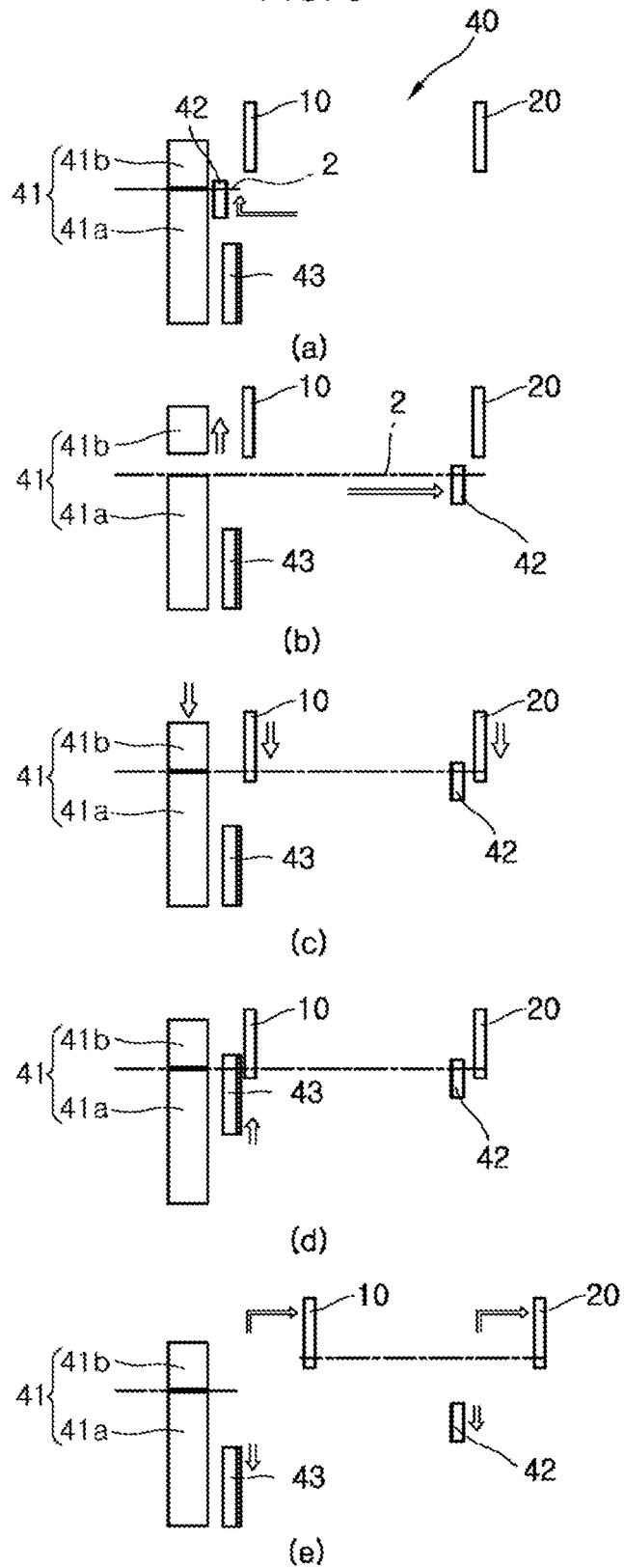
FIG. 5 is a conceptual diagram illustrating an example of gripping a wire by a wire transfer apparatus of a tabbing apparatus according to an embodiment of the present invention.
Figure 6:
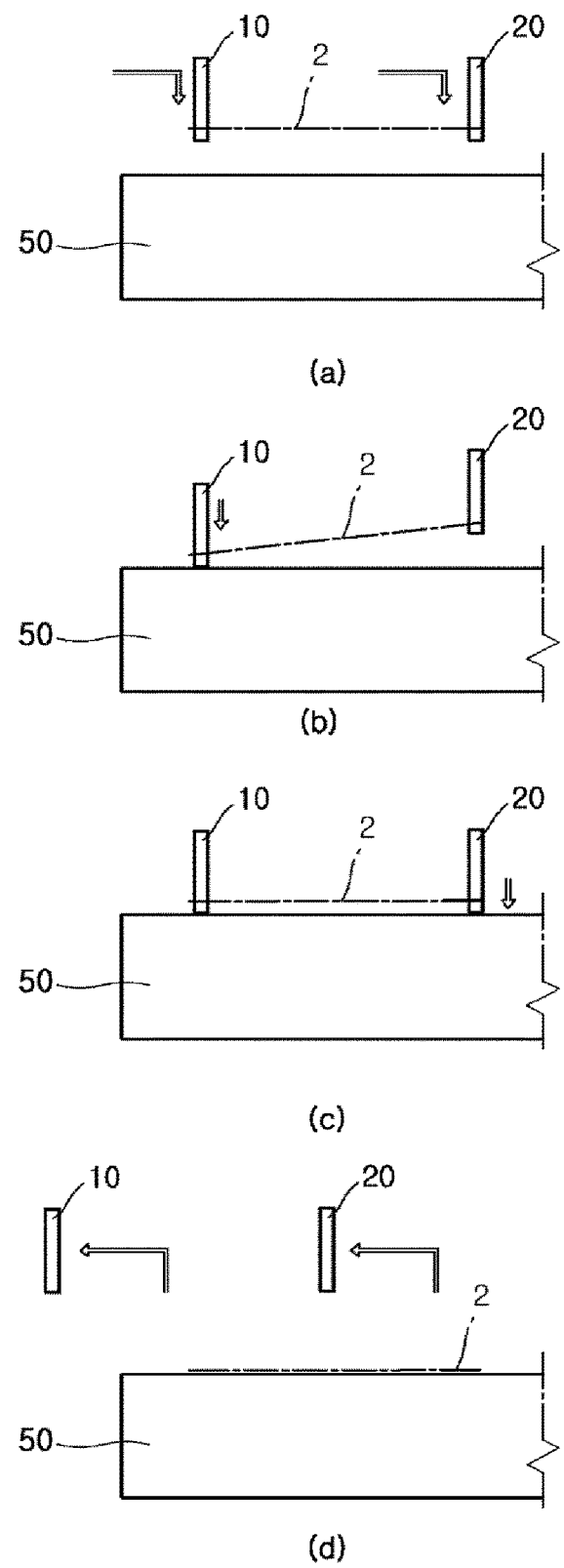
FIG. 6 is a conceptual diagram illustrating an example of placing a wire at a desired position by a wire transfer apparatus of a tabbing apparatus according to an embodiment of the present invention.

FIG. 5 is a conceptual diagram illustrating an example of gripping a wire by a wire transfer apparatus of a tabbing apparatus according to an embodiment of the present invention. FIG. 6 is a conceptual diagram illustrating an example of placing a wire at a desired position by a wire transfer apparatus of a tabbing apparatus according to an embodiment of the present invention.

Referring to FIG. 1, a wire transfer apparatus 1 of a tabbing apparatus according to an embodiment of the present invention includes a first transfer gripper unit 10, a second transfer gripper unit 20, a gripper transfer unit 30 and a wire movement device 40.

The first transfer gripper unit 10 is a device configured to grip one side of a wire 2. The second transfer gripper unit 20 is a device configured to grip the wire 2 at a location spaced apart from the first transfer gripper unit 10, together with the first transfer gripper unit 10, and is disposed in parallel to the first transfer gripper unit 10. For convenience of explanation, it will be hereinafter assumed that the wire 2 has a set length corresponding to a spaced distance between the first transfer gripper unit 10 and the second transfer gripper unit 20.

The gripper transfer unit 30 is a device configured to transfer the wire 2 to the desired position while moving the first transfer gripper unit 10 and the second transfer gripper unit 20. The first transfer gripper unit 10 and the second transfer gripper unit 20 are moved by the same displacement by the gripper transfer unit 30 and transfer the wire 2 to the desired position, in a state where one side and the opposite side of the wire 2 extending in a horizontal direction are respectively gripped by the first transfer gripper unit 10 and the second transfer gripper unit 20.

The wire movement device 40 is a device configured to supply and move the wire 2 to a transfer standby position and configured to cut the wire 2 at the set length corresponding to the distance between the first transfer gripper unit 10 and the second transfer gripper unit 20. The first transfer gripper unit 10 and the second transfer gripper unit 20 reciprocate between the transfer standby position and a desired transfer position due to the drive of the gripper transfer unit 30, thereby repeatedly transferring the wires 2 having the set length to the desired position.

Referring to FIG. 1, the first transfer gripper unit 10 according to an embodiment of the present invention includes a first gripper 11, a second gripper 13 and a gap adjustment device 15.

The first gripper 11 includes a plurality of first wire contact portions 12 which make contact with one side surface of the wire 2. The second gripper 13 includes a plurality of second wire contact portions 14 which are located to face the first wire contact portions 12 respectively and make contact with the opposite side surface of the wire 2. The first wire contact portion 12 of the first gripper 11 and the second wire contact portion 14 of the second gripper 13 form a shape of a tong for gripping the wire 2 together.

The gap adjustment device 15 is a device configured to adjust the gap between the first gripper 11 and the second gripper 13, and particularly, the gap between the first wire contact portion 12 and the second wire contact portion 12. Referring to FIG. 2, the gap adjustment device 15 according to an embodiment of the present invention includes a first gripper pressurizing unit 16 and a second gripper pressurizing unit (not shown).

The first gripper pressurizing unit 16 pressurizes the first gripper 11 toward the second wire contact portion 14. The first gripper pressurizing unit 16 may include a cylinder member configured to pressurize the first gripper 11 at a set pressure. The second gripper pressurizing unit pressurizes the second gripper 13 toward the first wire contact portion 12. The second gripper pressurizing unit may include a cylinder member configured to pressurize the second gripper 13 at a set pressure.

Referring to FIG. 3, the wire 2 may be gripped at a position P by simultaneously actuating the first gripper pressurizing unit 16 and the second gripper pressurizing unit, i.e., by simultaneously applying pressurizing forces to the first gripper 11 and the second gripper 13 to move the first gripper 11 and the second gripper 13 at distances $d_1$ and $d_2$ respectively in a direction in which the first wire contact portion 12 and the second wire contact portion 14 face each other. Here, "$d_1$" denotes a movement distance of the first gripper 11, and "$d_2$" denotes a movement distance of the second gripper 13.

Referring to FIG. 4, the wire 2 may be gripped at the position P by moving only the first gripper 11 by the first gripper pressurizing unit 16. In this case, no pressurizing force may be applied to the second gripper 13 or a pressurizing force of a degree insufficient to move the second gripper 13 may be applied to the second gripper 13.

The second transfer gripper unit 20 according to an embodiment of the present invention has a structure corresponding to the structure of the first transfer gripper unit 10 including the first gripper 11, the second gripper 13 and the gap adjustment device 15, and is located facing the first transfer gripper unit 10. Thus, the second transfer gripper unit 20 will not be described in detail here.

Referring to FIGS. 1 and 2, the gripper transfer unit 30 according to an embodiment of the present invention includes a horizontal movement unit 31, a vertical movement unit 34, and a position adjustment unit 37.

The horizontal movement unit 31 is a device configured to move the first transfer gripper unit 10 and the second transfer gripper unit 20 in a horizontal direction corresponding to a linear path from the transfer standby position to the desired transfer position. For example, when the wire 2 is transferred in a forward direction from the transfer standby position, the horizontal movement unit 31 is operated to move the first transfer gripper unit 10 and the second transfer gripper unit 20 in the forward direction or a backward direction. Referring to FIGS. 1 and 2, the horizontal movement unit 31 according to an embodiment of the present invention includes a horizontal transfer unit 32 and a distance adjustment unit 33.

The horizontal transfer unit 32 is a device configured to move the first transfer gripper unit 10 and the second transfer gripper unit 20 together by the same displacement The horizontal transfer unit 32 according to an embodiment of the present invention includes a rail, a base member and a base movement device.

The rail is installed to linearly extend between the transfer standby position and the desired transfer position. The base member is a member configured to support the first transfer gripper unit 10 and the second transfer gripper unit 20, and is installed to be movable along the rail. The base member includes a first base member connected to the rail via the position adjustment unit 37, and a second base member connected to the first base member via an elevating transfer unit 35.

The base movement device pressurizes the first base member (more particularly, a lower base member of the position adjustment unit 37 connected to the first base member) to be moved along the rail in a reciprocating manner. The base movement device may be an actuator for generating linear displacement, such as a motor for driving a cylinder member, a ball screw, a linear guide, etc. for applying a moving force to the first base member or the lower base member of the position adjustment unit 37 to be moved along the rail.

The distance adjustment unit 33 is a device configured to adjust the distance between the first transfer gripper unit 10 and the second transfer gripper unit 20 according to the length of the wire 2. Referring to FIGS. 1 and 2, the distance adjustment unit 33 according to an embodiment of the present invention includes a first horizontal movement unit 331, a second horizontal movement unit 332 and support rail units 333.

The first horizontal movement unit 331 is a device configured to move the first transfer gripper unit 10 in a horizontal direction. By driving the first horizontal movement unit 331, a horizontal position of the first transfer gripper unit 10 may be adjusted independently from the second transfer gripper unit 20. The first horizontal movement unit 331 according to an embodiment of the present invention is installed on the second base member of the horizontal transfer unit 32, includes a gripper support platform 362, a horizontal movement device and a horizontal driving device, and is connected to the first transfer gripper unit 10.

The gripper support platform 362 is a member configured to support the first transfer gripper unit 10 and is installed to extend in a vertical direction. The first transfer gripper unit 10 is installed on a side surface of the gripper support platform 362. The horizontal movement device supports the gripper support platform 362 to be movable in the horizontal direction. The horizontal movement device may be a device for generating linear displacement, such as a ball screw, a linear guide, etc. The horizontal driving device may be an actuator, such as a motor for driving a ball screw, a cylinder member for applying a moving force to the gripper support platform 362, etc.

The second horizontal movement unit 332 is a device configured to move the second transfer gripper unit 20 in a horizontal direction. By driving the second horizontal movement unit 332, a horizontal position of the second transfer gripper unit 20 may be adjusted independently from the first transfer gripper unit 10. The second horizontal movement unit 332 has a structure corresponding to the structure of the first horizontal movement unit 331 including the gripper support platform 362, the horizontal movement device, and the horizontal driving device, and thus will not be described in detail here.

The horizontal positions of and the distance between the first transfer gripper unit 10 and the second transfer gripper unit 20 on the second base member may be adjusted to various levels using the first horizontal movement unit 331 and the second horizontal movement unit 332.

The support rail units 333 are guide devices configured to support the gripper support platform 362 on which the first transfer gripper unit 10 and the second transfer gripper unit 20 are installed, such that the gripper support platform 362 is movable in the horizontal direction. The support rail units 333 are installed on the top and bottom of the horizontal movement device to be parallel to the horizontal movement device.

Since the first transfer gripper unit 10 or the second transfer gripper unit 20 is coupled to one side of the gripper support platform 362, the weight of the first transfer gripper unit 10 or the second transfer gripper unit 20 is biasedly applied to the gripper support platform 362. However, since upper and lower portions of the gripper support platform 362 may be stably coupled to the second base member by using the support rail unit 333, the gripper support platform 362 may be prevented from being tilted to one side when the weight of the first transfer gripper unit 10 or the second transfer gripper unit 20 is biasedly applied to the gripper support platform 362.

The vertical movement unit 34 is a device configured to move the first transfer gripper unit 10 and the second transfer gripper unit 20 in a vertical direction. The first transfer gripper unit 10 and the second transfer gripper unit 20 may be brought toward or apart from either the wire 2 or an object on which the wire is to be placed and may be prevented from being interfered with by another device that is on a path along which the wire 2 is transferred, while the first transfer gripper unit 10 and the second transfer gripper unit 20 are moved in the vertical direction by the vertical movement unit 34. Referring to FIGS. 1 and 2, the vertical movement unit 34 according to an embodiment of the present invention includes an elevating transfer unit 35 and a height adjustment unit 36.

The elevating transfer unit 35 is a device configured to vertically move the first transfer gripper unit 10 and the second transfer gripper unit 20 together by the same displacement. The elevating transfer unit 35 according to an embodiment of the present invention is installed on the first base member and supports the second base member to be movable in the vertical direction. The elevating transfer unit 35 may be a device for generating linear displacement, such as a ball screw, a linear guard, a cylinder member, etc.

The height adjustment unit 36 adjusts the heights of the first transfer gripper unit 10 and the second transfer gripper unit 20 independently. By using the height adjustment unit 36, one side and the opposite side of the wire 2 may be sequentially moved down or up as illustrated in FIGS. 6(a) to 6(d). A reference numeral "50" illustrated in FIG. 6 denotes an object on which the wire 2 is to be placed. Referring to FIGS. 1 and 2, the height adjustment unit 36 according to an embodiment of the present invention includes a first vertical movement unit 361 and a second vertical movement unit 366.

The first vertical movement unit 361 is a device configured to move the first transfer gripper unit 10 in a vertical direction. By driving the first vertical movement unit 361, the height of the first transfer gripper unit 10 may be adjusted independently from the second transfer gripper unit 20. The first vertical movement unit 361 according to an embodiment of the present invention is installed on the gripper support platform 362, includes a vertical driving device 363, a vertical movement device 364 and a vertical guide rail 365, and is connected to the first transfer gripper unit 10.

The vertical movement device 364 is configured to support the first transfer gripper unit 10 to be movable in a vertical direction. The vertical movement device may be a device for generating linear displacement, such as a ball screw, a linear guide, etc. The horizontal driving device 363 may be an actuator, such as a motor for driving a ball screw, a cylinder member for applying a moving force to the gripper support platform 362, etc.

The vertical guide rail 365 is a guide device configured to support the first transfer gripper unit 10 to be movable in the vertical direction, together with the vertical movement device 364, and is installed in parallel to the vertical movement device 364. The first transfer gripper unit 10 may be stably coupled to the gripper support platform 362 at a plurality of places corresponding to the vertical movement device 364 and the vertical guide rail 365. Thus, the first transfer gripper unit 10 may be stably moved in the vertical direction without being shaken or rotated while the vertical driving device 363 and the vertical movement device 364 are operated.

The second vertical movement unit 366 is a device configured to move the second transfer gripper unit 20 in a vertical direction. By driving the second vertical movement unit 366, the height of the second transfer gripper unit 20 may be adjusted independently from the first transfer gripper unit 10. The second vertical movement unit 366 has a structure corresponding to the structure of the first vertical movement unit 361 including the vertical driving device 363, the vertical movement device 364 and the vertical guide rail 365, and thus will not be described in detail here.

The position adjustment unit 37 is a device configured to move the first transfer gripper unit 10 and the second transfer gripper unit 20 in a horizontal direction perpendicular to the horizontal movement unit 31. When the horizontal movement unit 31 has displacement in the forward and backward directions, the position adjustment unit 37 has displacement in left and right directions. The position adjustment unit 37 according to an embodiment of the present invention includes a lower base member, a base movement device and a guide rail, and is installed between the horizontal transfer unit 32 and the first base member.

The lower base member is installed to be movable along the rail of the horizontal transfer unit 32. The base movement device is installed on the lower base member, and supports the first base member to be moved in the left and right directions. The base movement device may be an actuator for generating linear displacement, such as a motor for driving a cylinder member, a ball screw, a linear guide, etc. for applying a moving force to the lower base member to be moved along the rail. The guide rail guides the movements of the first base member in the left and right directions.

When a condition of transferring the wire 2 is changed, e.g., when a transfer position of the wire 2 is changed, forward and backward positions on which the first transfer gripper unit 10 and the second transfer gripper unit 20 are to be placed may be adjusted using the horizontal transfer unit 32. Further, left and right positions on which the first transfer gripper unit 10 and the second transfer gripper unit 20 are to be placed may be adjusted using the position adjustment unit 37.

Referring to FIG. 5, the wire movement device 40 according to an embodiment of the present invention includes a fixing gripper 41, a movement gripper 42, and a wire cut device 43.

The fixing gripper 41 pressurizes and fixes the wire 2 behind the transfer standby position, i.e., behind positions at which the first transfer gripper unit 10 and the second transfer gripper unit 20 stand by, as illustrated in FIG. 5(a). The fixing gripper 41 includes a support unit 41a for supporting a lower end of the wire 2, and a gripping unit 41b installed on the support unit 41a to be movable in a vertical direction. By moving the gripping unit 41*b* up or down, the wire 2 may be pressurized against the support unit 41*a* to be fixed or may be unfixed.

As illustrated in FIG. 5(*b*), the movement gripper 42 moves the wire 2 by pulling the wire 2 to the front of the transfer standby position by a set length in a state wherein the wire 2 is unfixed from the fixing gripper 41.

The wire cut device 43 cuts a portion of the wire 2 located between the first transfer gripper unit 10 and the fixing gripper 41 as illustrated in FIGS. 5(*d*) and 5(*e*), in a state wherein a portion of the wire 2 located between the fixing gripper 41 and the movement gripper 42 is gripped by the first transfer gripper unit 10 and the second transfer gripper unit 20 as illustrated in FIG. 5(*c*). By continuously and repeatedly performing the process illustrated in FIGS. 5(*a*) to 5(*e*), the wire 2 may be repeatedly and continuously cut at the set length while the wire 2 is moved to the transfer standby position.

In the wire transfer apparatus 1 of a tabbing apparatus having the above structure according to an embodiment of the present invention, the first transfer gripper unit 10 and the second transfer gripper unit 20 may be moved by the same displacement by using the gripper transfer unit 30 in a state wherein one side and the opposite side of the wire 2 are respectively gripped by the first transfer gripper unit 10 and the second transfer gripper unit 20. Accordingly, the wire 2 may be stably transferred to a desired position without causing stress that deforms the wire 2 to be applied to the wire 2.

While the present invention has been described with reference to the embodiments shown in the drawings, those embodiments are only illustrative. It will be apparent to those of ordinary skill in the technical field that various modifications and equivalents may be made from those embodiments. Accordingly, the technical protection scope of the present invention should be defined by the appended claims.

What is claimed is:

1. A wire transfer apparatus of a tabbing apparatus, comprising:
   a first transfer gripper unit to grip a wire;
   a second transfer gripper unit to grip the wire at a location spaced apart from the first transfer gripper unit together with the first transfer gripper unit, the second transfer gripper unit being disposed in parallel to the first transfer gripper unit; and
   a gripper transfer unit to transfer the wire while moving the first transfer gripper unit and the second transfer gripper unit,
   wherein the first transfer gripper unit comprises:
   a first gripper including a first wire contact portion;
   a second gripper to grip the wire together with the first gripper, and including a second wire contact portion facing the first wire contact portion; and
   a gap adjustment device to adjust a gap between the first gripper and the second gripper.

2. The wire transfer apparatus of claim 1 wherein the gap adjustment device comprises a first gripper pressurizing unit to pressurize the first gripper toward the second wire contact portion.

3. The wire transfer apparatus of claim 2, wherein the gap adjustment device further comprises a second gripper pressurizing unit to pressurize the second gripper toward the first wire contact portion.

4. The wire transfer apparatus of claim 1, wherein the gripper transfer unit comprises a horizontal movement unit to move the first transfer gripper unit and the second transfer gripper unit in a horizontal direction.

5. The wire transfer apparatus of claim 4, wherein the horizontal movement unit comprises:
   a horizontal transfer unit to move the first transfer gripper unit and the second transfer gripper unit together by the same displacement; and
   a distance adjustment unit to adjust a distance between the first transfer gripper unit and the second transfer gripper unit.

6. The wire transfer apparatus of claim 5, wherein the distance adjustment unit comprises:
   a first horizontal movement unit to move the first transfer gripper unit in a horizontal direction; and
   a second horizontal movement unit to move the second transfer gripper unit in a horizontal direction.

7. The wire transfer apparatus of claim 4, wherein the gripper transfer unit further comprises a vertical movement unit to move the first transfer gripper unit and the second transfer gripper unit in a vertical direction.

8. The wire transfer apparatus of claim 7, wherein the vertical movement unit comprises:
   an elevating transfer unit to move the first transfer gripper unit and the second transfer gripper unit together by the same displacement; and
   a height adjustment unit to adjust heights of the first transfer gripper unit and the second transfer gripper unit independently.

9. The wire transfer apparatus of claim 8, wherein the height adjustment unit comprises:
   a first vertical movement unit to move the first transfer gripper unit in a vertical direction; and
   a second vertical movement unit to move the second transfer gripper unit in a vertical direction.

10. The wire transfer apparatus of claim 4, wherein the gripper transfer unit further comprises a position adjustment unit to move the first transfer gripper unit and the second transfer gripper unit in a horizontal direction perpendicular to the horizontal movement unit.

11. A wire transfer apparatus of a tabbing apparatus, comprising:
    a first transfer gripper unit to grip a wire;
    a second transfer gripper unit to grip the wire at a location spaced apart from the first transfer gripper unit together with the first transfer gripper unit, the second transfer gripper unit being disposed in parallel to the first transfer gripper unit: and
    a gripper transfer unit to transfer the wire while moving the first transfer gripper unit and the second transfer gripper unit, and
    a wire movement device to move the wire to a transfer standby position and to cut the wire at a set length corresponding to a distance between the first transfer gripper unit and the second transfer gripper unit.

12. The wire transfer apparatus of claim 11, wherein the wire movement device comprises:
    a fixing gripper to pressurize and fix the wire;
    a movement gripper to move the wire by pulling the wire by a set distance in a state wherein the wire is unfixed from the fixing gripper; and
    a wire cut device to cut a portion of the wire located between the first transfer gripper unit and the fixing gripper in a state wherein a portion of the wire located between the fixing gripper and the movement gripper is gripped by the first transfer gripper unit and the second transfer gripper unit.

* * * * *